(12) United States Patent
Guarin et al.

(10) Patent No.: US 7,723,824 B2
(45) Date of Patent: May 25, 2010

(54) METHODOLOGY FOR RECOVERY OF HOT CARRIER INDUCED DEGRADATION IN BIPOLAR DEVICES

(75) Inventors: Fernando Guarin, Millbrook, NY (US); J. Edwin Hostetter, Jr., Pleasant Valley, NY (US); Stewart E. Rauch, III, Poughkeepsie, NY (US); Ping-Chuan Wang, Hopewell Junction, NY (US); Zhijian J. Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 11/744,621

(22) Filed: May 4, 2007

(65) Prior Publication Data

US 2007/0205434 A1 Sep. 6, 2007

Related U.S. Application Data

(62) Division of application No. 10/904,985, filed on Dec. 8, 2004, now Pat. No. 7,238,565.

(51) Int. Cl.
*H01L 29/73* (2006.01)
(52) U.S. Cl. ............... 257/578; 257/582; 257/E27.053
(58) Field of Classification Search ................ 257/578, 257/582, 378, 588, E27.053
See application file for complete search history.

(56) References Cited

U.S. PATENT DOCUMENTS

| | | | |
|---|---|---|---|
| 3,602,841 A | 8/1971 | McGroddy | |
| 4,397,695 A | 8/1983 | Arlt et al. | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,106,767 A * | 4/1992 | Comfort et al. ............. | 438/359 |

(Continued)

*Primary Examiner*—Jerome Jackson, Jr.
*Assistant Examiner*—Paul A Budd
(74) *Attorney, Agent, or Firm*—Scully, Scott, Murphy & Presser, P.C.; Joeseph P. Abate, Esq.

(57) ABSTRACT

A method for recovery of degradation caused by avalanche hot carriers is provided that includes subjecting an idle bipolar transistor exhibiting avalanche degradation to a thermal anneal step which increases temperature of the transistor thereby recovering the avalanche degradation of the bipolar transistor. In one embodiment, the annealing source is a self-heating structure that is a Si-containing resistor that is located side by side with an emitter of the bipolar transistor. During the recovering step, the bipolar transistor including the self-heating structure is placed in the idle mode (i.e., without bias) and a current from a separate circuit is flown through the self-heating structure. In another embodiment of the present, the annealing step is a result of providing a high forward current (around the peak fT current or greater) to the bipolar transistor while operating below the avalanche condition ($V_{CB}$ of less than 1 V). Under the above conditions, about 40% or greater of the degradation can be recovered. In yet another embodiment of the present invention, the thermal annealing step may include a rapid thermal anneal (RTA), a furnace anneal, a laser anneal or a spike anneal.

15 Claims, 5 Drawing Sheets

U.S. PATENT DOCUMENTS

| | | | |
|---|---|---|---|
| 5,108,843 A | 4/1992 | Ohtaka et al. | |
| 5,134,085 A | 7/1992 | Gilgen et al. | |
| 5,310,446 A | 5/1994 | Konishi et al. | |
| 5,340,753 A * | 8/1994 | Bassous et al. | 438/366 |
| 5,354,695 A | 10/1994 | Leedy | |
| 5,371,399 A | 12/1994 | Burroughes et al. | |
| 5,391,503 A | 2/1995 | Miwa et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy et al. | |
| 5,592,007 A | 1/1997 | Leedy | |
| 5,592,018 A | 1/1997 | Leedy | |
| 5,670,798 A | 9/1997 | Schetzina | |
| 5,675,175 A * | 10/1997 | Iranmanesh | 257/565 |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,886,713 A * | 3/1999 | Okada et al. | 347/14 |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,476,462 B2 | 11/2002 | Shimizu et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,956,255 B2 * | 10/2005 | Oue et al. | 257/276 |
| 2001/0009784 A1 | 7/2001 | Ma et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0020121 A1 * | 1/2003 | Rockwell et al. | 257/378 |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |

\* cited by examiner

METHODOLOGY FOR RECOVERY OF HOT CARRIER INDUCED DEGRADATION IN BIPOLAR DEVICES

RELATED APPLICATIONS

This application is a divisional of U.S. patent application Ser. No. 10/904,985, filed Dec. 8, 2004.

FIELD OF THE INVENTION

The present invention relates to bipolar transistors, and more particularly to silicon-containing, e.g., SiGe, heterojunction bipolar transistors (HBTs) that include a self-heating structure in the circuit level that obviates avalanche carrier related damages which typically decrease the drive current gain in both the forward and reverse bias mode. The present invention also provides a method for recovering hot carrier induced degradation of HBTs and other like bipolar transistors.

BACKGROUND OF THE INVENTION

Bipolar transistors are electronic devices with two p-n junctions that are in close proximity to each other. A typical bipolar transistor has three device regions: an emitter, a collector, and a base disposed between the emitter and the collector. Ideally, two p-n junctions, i.e., the emitter-base and collector-base junctions, are separated by a specific distance. Modulation of the current flow in one p-n junction by changing the bias of the nearby junction is called "bipolar transistor action".

If the emitter and collector are doped n-type and the base is doped p-type, the device is an "npn" transistor. Alternatively, if the opposite doping configuration is used, the device is a "pnp" transistor. Because the mobility of minority carriers, i.e., electrons, in the base region of npn transistors is higher than that of holes in the base of pnp transistors, higher frequency operation and higher speed performances can be obtained with npn transistors. Therefore, npn transistors comprise the majority of bipolar transistors used to build integrated circuits.

As the vertical dimensions of bipolar transistors are scaled more and more, serious device operational limitations have been encountered. One actively studied approach to overcome these limitations is to build transistors with emitter materials whose band gap is larger than the band gap of the material used in the base. Such structures are referred to in the art as 'heterojunction' transistors.

Heterostructures comprising heterojunctions can be used for both majority carrier and minority carrier devices. Among minority carrier devices, heterojunction bipolar transistors (HBTs) in which the emitter is formed of Si and the base of a silicon germanium (SiGe) alloy have recently been developed. The SiGe alloy is narrower in band gap than silicon.

The advanced SiGe bipolar and complementary metal oxide semiconductor (BiCMOS) technology uses a SiGe base in the HBT. In the higher-frequency (such as multi-GHz) regime, conventional compound semiconductors such as, for example, GaAs and InP, currently dominate the market for high-speed wired and wireless communication devices. SiGe BiCMOS promises not only a comparable performance to GaAs in devices such as power amplifiers, but also a substantial cost reduction due to integration of HBTs with standard CMOS, yielding the so-called "system on a chip".

As silicon germanium (SiGe) heterojunction bipolar transistor (HBT) performance moves up over 200 GHz, it has become apparent that the avalanche degradation mechanism becomes the dominant reliability concern for SiGe HBT circuit applications. This is due to the fact that the high frequency performance of the bipolar transistor is achieved by vertical scaling of the device, which decreases the vertical depth of the junctions and increases the electrical field within the device. This high electrical field at the collector-base junction during operation generates high energetic carriers that can damage the insulating interfaces around the device's emitter and shallow trench isolation (STI) interfaces. Avalanche carrier related damages will decrease (or degrade) the device current gain in both forward and reverse active mode.

The avalanche degradation mechanism was recently discovered and it imposes a very big constraint for high frequency and high power performance of SiGe HBTs. See, for example, G. Zhang, et al., "A New Mixed-Mode Base Current Degradation Mechanism in Bipolar Transistors", IEEE BCTM 1.4, 2002 and Z. Yang, et al., "Avalanche Current Induced Hot Carrier Degradation in 200 GHz SiGe Heterojunction Bipolar Transistors", Proc. International Reliability Physics Symposium, pp. 339-343, 2003.

A sample avalanche degradation of a typical SiGe HBT is shown in FIG. 1. Specifically, FIG. 1 shows the current before the stress (T0) and after 3000 seconds (T1) avalanche stress for an IBM 200 GHz SiGe HBT with an emitter size of 0.8×0.8 µm² stressed at $V_{CB}$=3.0 V and IE=5.12 mA. Operation in the avalanche regime has become more and more important for SiGe HBTs in high frequency applications; See, for example, H. Li, et al., "Design of W-Band VCOs with High Output Power for Potential Application in 77 GHz Automotive Radar Systems", IEEE GaAs Digest, pp. 263-266 (2003). $V_{CB}$ denotes the collector base voltage and IE denotes the emitter current.

Any methods to recover the avalanche degradation will greatly benefit the SiGe HBT circuit's performance and application range. However, there has not been any recovery method reported in the prior art to date because this degradation mechanism has only been fully investigated in the last year or so.

In view of the above, there is a need for providing a method to recover the avalanche degradation mentioned above in order to fabricate bipolar transistors, particularly SiGe HBTs, that can operate at the high frequencies currently required for the present generation of bipolar transistors.

SUMMARY OF THE INVENTION

Avalanche degradation is caused by avalanche hot carriers, which are highly energetic carriers that originate from the impact ionization of the collector-base junction when a bipolar transistor, particularly a SiGe HBT, is operating in the forward active mode. The avalanche hot carriers create damage within the bipolar transistor and decrease the device's current gain by increasing base current. The hot carrier effect is worse for the newer generation bipolar transistor devices and it increases in the collector-base junction with the increase of device performance. Moreover, avalanche hot carriers affect the breakdown voltage of bipolar transistors, especially SiGe HBTs. Specifically, a high avalanche current results in low breakdown voltage of the bipolar transistor.

Despite being possible to work outside the avalanche regime ($V_{CB}$ less than 1 V), operation in the avalanche region ($V_{CB}$ greater than 1V) is necessary to achieve high output power for high frequency bipolar transistors, e.g., SiGe HBTs. High output power is required for radar and wireless communication applications. In SiGe HBT technologies, the avalanche reliability is the major concern. $V_{CB}$ denotes the voltage between the collector and base.

The recovery of avalanche degradation is important since the avalanche degradation effect mentioned above is getting worse with high unity current gain frequency fT devices. For example, a 1% current gain degradation was observed for a 200 GHz SiGe HBT, while 10% current gain degradation was observed for a 300 GHz SiGe HBT, after similar stress. Moreover, it is important to recover the avalanche degradation since the device hot carrier lifetime goes with the square of the degradation. For instance, if the degradation recovers by 50%, then the lifetime will be extended by 4×.

In view of the above the present invention provides a method and structure for recovering the avalanche degradation that is exhibited by prior art bipolar transistors, especially SiGe HBTs. In particular, the applicants of the present invention have discovered that the degradation caused by the avalanche effect described above can be significantly recovered by increasing the collector-base junction temperature utilizing a thermal anneal.

Specifically, and in broad terms, the method of the present invention thus comprises subjecting an idle bipolar transistor such as a HBT exhibiting avalanche degradation to a thermal anneal step which increases temperature of the transistor thereby recovering said avalanche degradation of said bipolar transistor.

In one embodiment of the present invention, the annealing source is a self-heating structure that is a Si-containing resistor that is located side by side with an emitter of the bipolar transistor. During the recovering step, the bipolar transistor including the self-heating structure is placed in the idle mode (i.e., without bias) and a current from a separate circuit is flown through the self-heating structure. The self-heating structure increases the temperature of the bipolar transistor to about 200° C. or greater. In a few hours, typically from about 1 to about 10 hours, the degradation will be recovered.

In another embodiment of the present, the annealing step is a result of providing a high forward current around the peak fT current to the bipolar transistor while operating below the avalanche condition ($V_{CB}$ of less than 1 V). Under the above conditions, about 40% or greater of the degradation can be recovered. This is due to self-heating effect of the bipolar transistor which means the device's effective temperature increases if the device is operating in the high power range. The peak fT current denotes the driving current needed for the device achieving maximum fT.

In yet another embodiment of the present invention, the thermal annealing step may include a rapid thermal anneal (RTA), a furnace anneal, a laser anneal, a spike anneal or any other like annealing step which can increase the temperature of the bipolar transistor to a temperature of about 200° C. or above.

In addition to the method described above, the present invention also provides a bipolar transistor, especially a HBT, structure that includes a self-heating element that is present at the device level which can be used to increase the temperature of the bipolar transistor thereby recovering avalanche degradation. Specifically, and in broad terms, the bipolar transistor structure of the present invention comprises a Si-containing semiconductor substrate having a collector located therein; a base located atop said collector, and an emitter located on said base, said emitter having extended portions which are self-aligned to outer edges of said base, said extended portions of said emitter serve as a heating element.

DETAILED DESCRIPTION OF THE INVENTION

The present invention, which provides a method and structure that can be used for the recovery of device degradation cause by avalanche hot carriers, will now be described in more detail by referring to the following drawings that accompany the present application. It is noted that the drawings of the inventive structure are provided herein for illustrative purposes and thus they are not drawn to scale.

Figure 1:
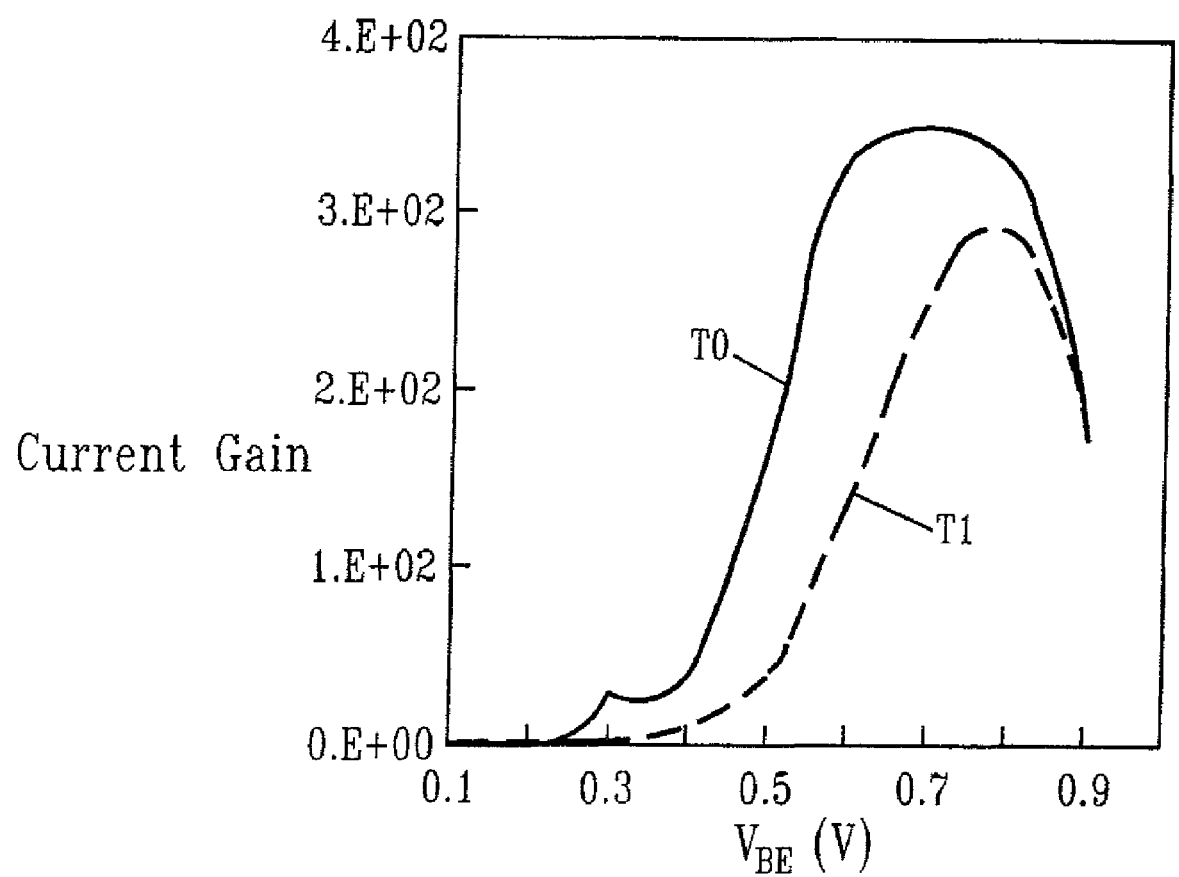
FIG. 1 is a plot of current gain vs. $V_{BE}$ (V) showing the current gain curves of a prior art SiGe HBT before stress (T0) and after 3000 seconds (T1) avalanche stress.
Figure 2:
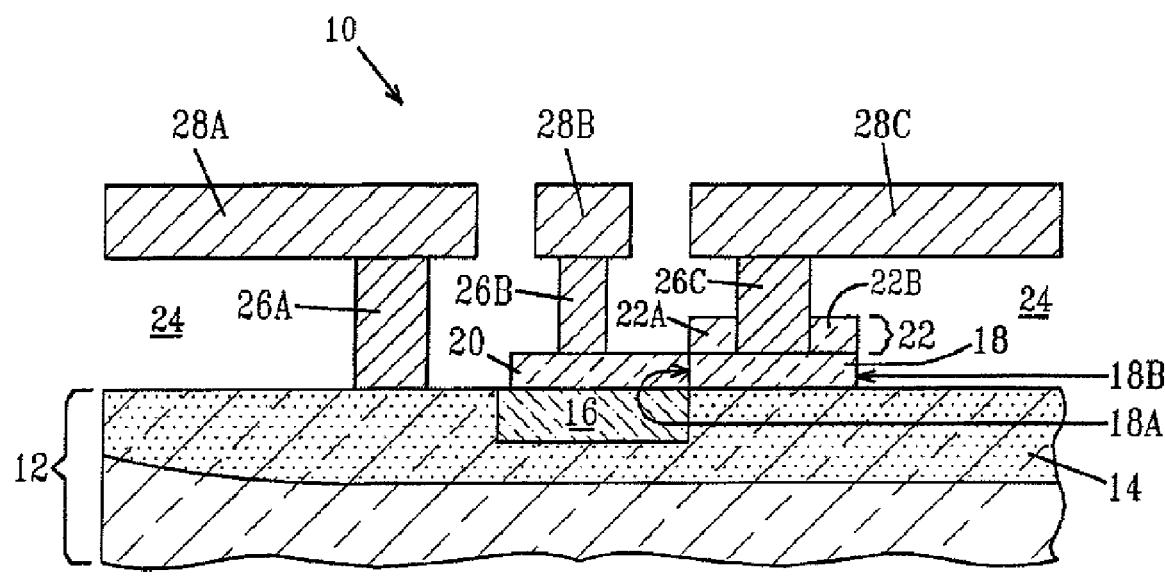
FIG. 2 is a cross sectional view of a bipolar transistor of the present invention.

Reference is first made to FIG. 2 in which the inventive bipolar transistor structure including a self-heating element is shown. The term "bipolar transistor" includes any electronic device that includes two p-n junctions in close proximity to each other. The bipolar transistors include an emitter, a collector and a base positioned between the emitter and the collector. The present invention is specifically related to HBTs, and more particularly to SiGe HBTs. Specifically, FIG. 2 illustrates a bipolar transistor structure 10 that includes a Si-containing semiconductor substrate 12 which has a collector 14 and a trench isolation region 16 located therein. The Si-containing semiconductor substrate 12 comprises any Si-containing semiconductor such as, for example, Si, SiGe, SiC, SiGeC, a silicon-on-insulator or a silicon germanium-on-insulator. Alternatively, the substrate 12 may be a Si layer such as epitaxial Si or amorphous Si formed atop a semiconductor substrate. The substrate 12 may include various doping or well regions.

As shown, substrate 12 includes a collector 14 that is formed into the substrate 12 via an ion implantation step. The trench isolation region 16 is made using techniques well known in the art including, for example, lithography, etching, optionally forming a trench liner, trench filling and, if needed, planarization. The trench fill material includes a trench dielectric material such as a high-density oxide or tetraethylorthosilicate (TEOS).

The structure 10 shown in FIG. 2 also includes a base 18 that is located atop the surface of the substrate 12; the portion of the base 18 that extends above the trench isolation region 16 is referred to as the extrinsic base. The extrinsic base is labeled by reference numeral 20 in the drawings of the present application.

The base 18, including the extrinsic base 20, is formed by a low temperature epitaxial growth process (typically 450°-700° C.). The base 18 and the extrinsic base 20 may comprise Si, SiGe or a combination of Si and SiGe. The base 18 can also be comprised of SiGeC or a combination of Si and SiGeC. Preferably, the base 18 and extrinsic base 20 are comprised of SiGe or a combination of Si and SiGeC. The base 18 is monocrystalline over the substrate 12, while the extrinsic base 20 is polycrystalline over the trench isolation region 16. The region, e.g., interface, in which monocrystalline material is converted to polycrystalline material is referred to as the facet region.

The structure 10 also includes an emitter 22 which is located atop the base 18. In accordance with the present invention, the emitter 22 has extended portions (labeled as 22A and 22B) that are self-aligned to outer edges 18A and 18B of the base 18. The extended portions 22A and 22B of the emitter 22 serve as a self-heating element within the structure. The emitter 22 comprises a doped semiconductor material such as polySi, Si or SiGe. Preferably, the emitter 22, including the extended portions 22A and 22B, are comprised of polySi. In such a preferred embodiment when the emitter 22 and the extended portions 22A and 22B are comprised of polySi, it is preferred that the base be comprised of SiGe.

The emitter 22 can be a layer with variable doping concentration, or a composition that can be grown in a state-of-the-art low temperature epitaxy system. The emitter 22 can also be formed by either an in-situ doping deposition process or by first deposition a polySi, Si or SiGe layer and then doping by ion implantation.

After forming the emitter 22, the emitter 22 is patterned by lithography and etching to provide the configuration shown in FIG. 2. Specifically, the patterning of the emitter comprises a wider patterned mask than that which is used in conventional bipolar transistor device manufacturing. The wider patterned mask allows for the formation of the inventive emitter 22 which includes the extended portions 22A and 22B which are self aligned with edges 18A and 18B, respectively, of the base 18.

The structure 10 also shown in FIG. 2 includes a dielectric material 24 that has conductively filled vias and lines located therein. The conductively filled vias are labeled by reference numeral 26A (contact via to the collector), 26B (contact via to the extrinsic base 20), and 26C (contact via to the emitter 22). The conductively filled lines are labeled as 28A (M1 collector line), 28B (M1 base line), and 28C (M1 emitter line). The dielectric material 24 having the conductively filled vias and lines is formed via a conventional back-end-of-the-line process. Specifically, a dielectric material such as an organosilicate glass, an oxide, or a polymeric composition, is applied to the entire structure via a deposition process such as, for example, chemical vapor deposition (CVD), plasma enhanced chemical vapor deposition (PECVD), chemical solution deposition or spin-on coating. Via and line openings are then formed by lithography and etching. A conductive metal such as W, Al, Cu or alloys thereof is then filled into the via and line opening and, if desired, a chemical mechanical polishing (CMP) or other like planarization process can be employed.

As shown in FIG. 2, the self-heating structure represented by extended emitter portions 22A and 22B is in the circuit level of the bipolar transistor device and it is side by side with the emitter 22 of the bipolar transistor. Under normal operation, the self-heating structure is floating and a high electrical field is generated at the collector-base junction which causes the formation of hot carriers that damage the device. During the recovery phase that occurs after normal operation, the bipolar transistor shown in FIG. 2 is placed in an idle mode (i.e., without biasing) and a current from another circuit (internal or external) is flown through the self-heating structure 22A and 22B. The self-heating structure 22A and 22b increases the temperature of the bipolar transistor to about 200° C. or greater. In a few hours, degradation will be recovered. Typically, the annealing step is performed for a time period from about 1 to about 10 hours.

Figure 3:
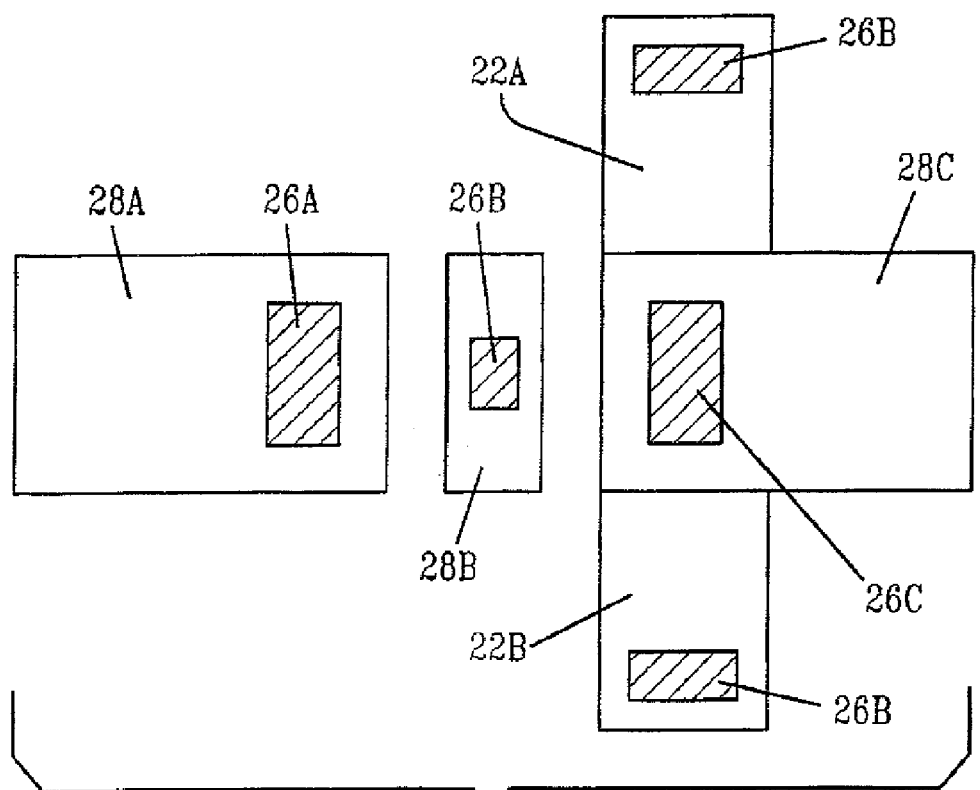
FIG. 3 is a schematic plan view of the inventive bipolar transistor during operation.
Figure 4:
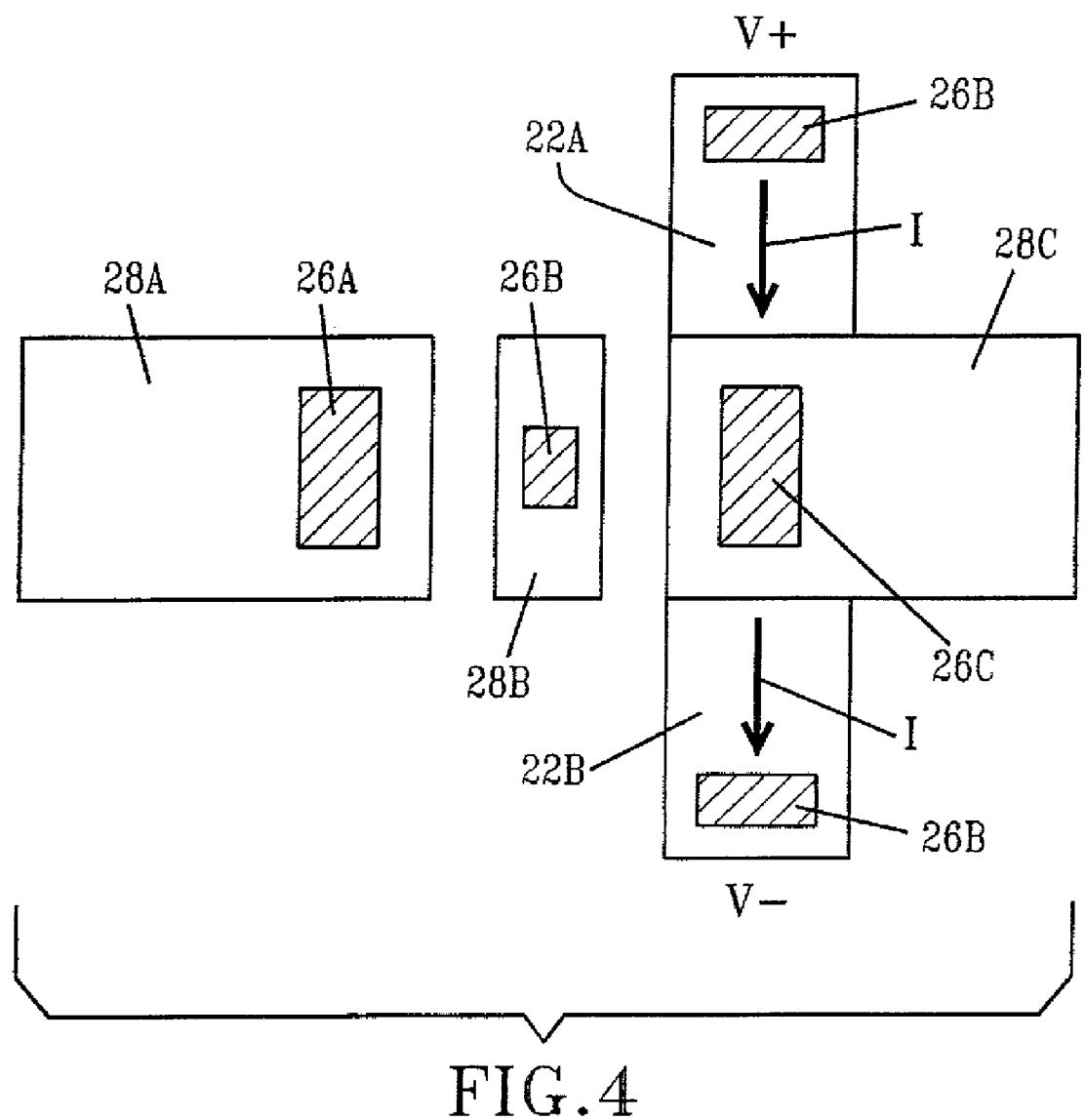
FIG. 4 is a schematic plan view of the inventive bipolar transistor during recovery.

FIG. 3 shows a schematic plan view of the bipolar transistor device of FIG. 2. During normal operation of the bipolar transistor device, the extended portions 22A and 22B (which represent a resistor) are kept floating. During recovery, the device is kept floating and the extended portions 22A and 22B are biased to generate heat directly to the degraded bipolar transistor device. The structure during the recovery mode is depicted in FIG. 4.

Figure 5:
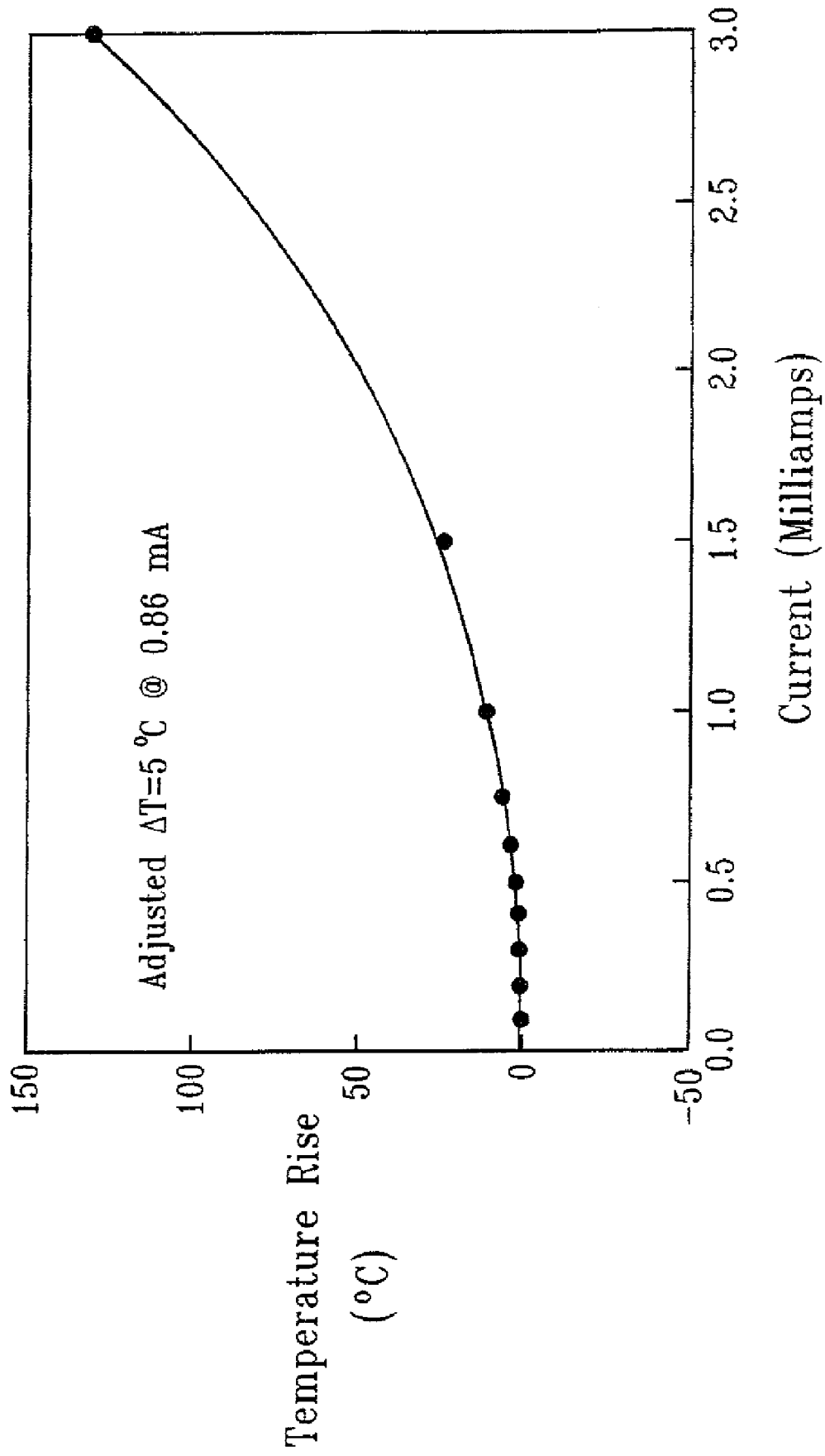
FIG. 5 is a plot showing the Joule heating characteristics performed on a polySi gate as a heater.

FIG. 5 illustrates the temperature rise caused during the recovery operation. Specifically, FIG. 5 shows the Joule heating characterization performed on the structure shown in FIG. 2 which includes the self-heating element 22A and 22B. A temperature rise of about 125° C. is observed when about 3 mA of current is driven through the self-heater.

Figure 6:
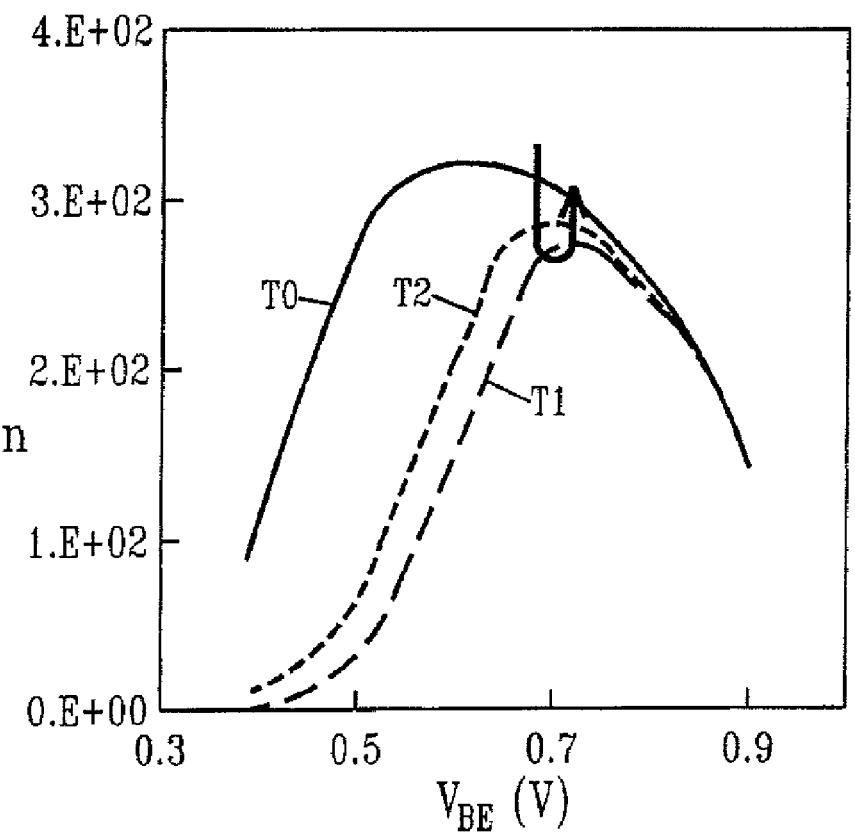
FIG. 6 is a plot of current gain vs. $V_{BE}$ (V) showing the current gain curves of the inventive structure before T0, after avalanche stress T1 and after recovery T2 by forward current.

FIG. 6 shows the current gain curves of a 0.12×2 $\mu m^2$ SiGe transistor before (T0), after avalanche stress (T1) and after recovery (T2) by forward current. The avalanche stress conditions is IE=0.288 mA with a $V_{CB}$=2.5 V for 4 K seconds. The recovery was conducted at 200° C. for 20 hours without any bias.

In addition to employing the self-heating structure described above to cause recovery of the hot carrier degradation of the bipolar transistor, the present invention also contemplates an embodiment in which any bipolar transistor device, including the one depicted above, is subjected to an annealing step in which a high forward current is applied to the bipolar transistor while operating below the avalanche condition. By 'high forward current' it is meant a current that is equal to or greater than peak fT. By 'below the avalanche condition' it is meant a $V_{CB}$ of less than 1 V, typically around 0.5 V. Under the above conditions, about 40% or greater of the degradation can be recovered. This is due to self-heating effect of the bipolar transistor which means the device effective temperature increases if the device is operating in the high power range.

Figure 7:
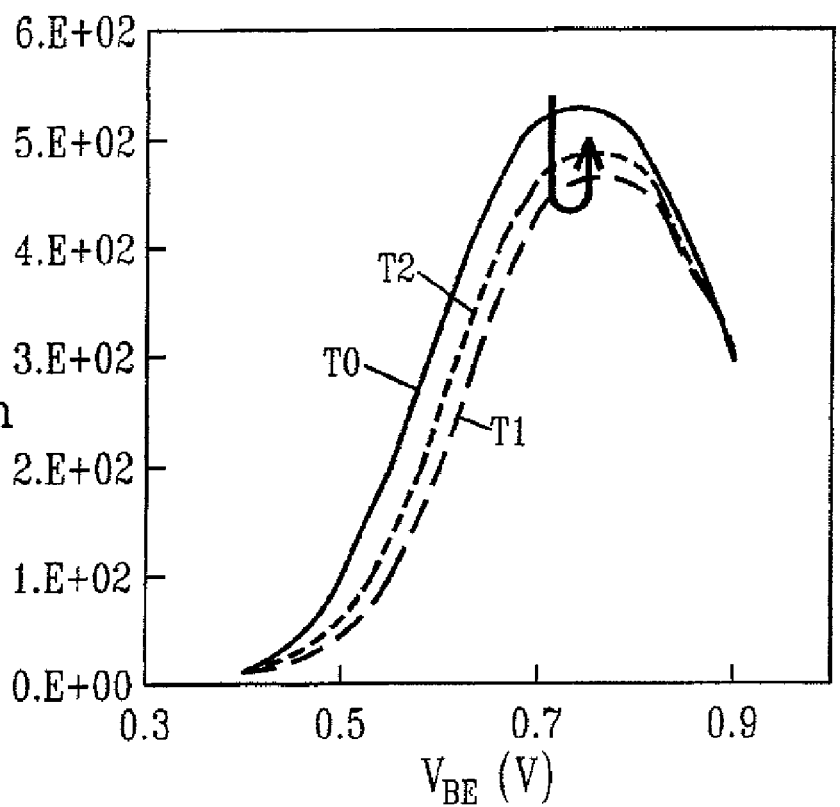
FIG. 7 is a plot of current gain vs. $V_{BE}$ (V) showing the current gain curves of the inventive structure before T0, after avalanche stress T1 and after recovery T2 by forward current.

FIG. 7 shows the current gain curves of a 0.12×2 $\mu m^2$ SiGe transistor before (T0), after avalanche stress (T1) and after recovery (T2) by forward current. The avalanche stress conditions is 1E=0.288 mA with a $V_{CB}$=2.5 V for 3 K seconds. The recovery was conducted at IE=2.88 mA with $V_{CB}$=1 V. The temperature was 30° C. during the entire experiment.

In yet another embodiment of the present invention, the thermal annealing step may include a rapid thermal anneal (RTA), a furnace anneal, a laser anneal a spike anneal or any other like annealing step which can increase the temperature of the bipolar transistor to a temperature of about 200° C. or above. When such annealing processes are employed, the annealing step is typically performed in the presence of an inert ambient such as Ar, He, Ne, $N_2$, Xe, Kr or mixtures thereof.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising
    a Si-containing semiconductor substrate having a collector located therein;

a base located atop said collector;

an emitter located on said base, wherein said emitter includes an emitter portion, a first extended portion laterally extending from said emitter portion, and a second extended portion laterally extending from said emitter region, wherein said emitter portion and said first and second extended portions comprise a same semiconductor material;

a first conductively filled via located on said first extended portion;

a second conductively filled via located on said second extended portion;

a device structure configured to provide current at least through said first conductively filled via, said first extended portion, said second extended portion, and said second conductively filled via; and another conductively filled via located directly on said emitter portion.

2. The semiconductor structure of claim 1 wherein said Si-containing semiconductor substrate comprises Si, SiGe, SiC, SiGeC, a silicon-on-insulator, a SiGe-on-insulator, or a Si layer atop a semiconductor substrate.

3. The semiconductor structure of claim 1 wherein said base comprises Si, SiGe, SiGeC or a combination of Si and SiGe or Si and SiGeC.

4. The semiconductor structure of claim 1 wherein said base comprises SiGe, Si or SiGeC.

5. The semiconductor structure of claim 1 further comprising an extrinsic base located adjacent to said base.

6. The semiconductor structure of claim 1 wherein said emitter comprises a doped semiconductor.

7. The semiconductor structure of claim 6 wherein said doped semiconductor comprises polysilicon, Si or SiGe.

8. The semiconductor structure of claim 7 wherein said doped semiconductor comprises polysilicon.

9. The semiconductor structure of claim 1 further comprises a conductively filled dielectric located atop said substrate, said base, and said emitter.

10. The semiconductor structure of claim 9 wherein said conductively filled dielectric includes vias and lines with are in contact with at least said collector and said emitter.

11. The semiconductor structure of claim 1 wherein said base comprises SiGe and said emitter comprises polysilicon.

12. The semiconductor structure of claim 1 wherein outer edges of said first extended region and said second extended region are aligned to outer edges of said base.

13. The semiconductor structure of claim 1 wherein said emitter portion, said first extended portion, and said second extended portion are of integral construction.

14. The semiconductor structure of claim 1 wherein said device structure is configured to provide current at least through said first conductively filled via, said first extended portion, said emitter portion, said second extended portion, and said second conductively filled via.

15. The semiconductor structure of claim 1 further comprising another device structure configured to make said first and second conductively filled vias electrically floating from a current source.

* * * * *